United States Patent
Yu (10) Patent No.: US 6,495,437 B1
(45) Date of Patent: Dec. 17, 2002

(54) LOW TEMPERATURE PROCESS TO LOCALLY FORM HIGH-K GATE DIELECTRICS

(75) Inventor: Bin Yu, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/781,039

(22) Filed: Feb. 9, 2001

(51) Int. Cl.[7] .................................. H01L 21/3205
(52) U.S. Cl. ....................... 438/591; 438/592; 438/584
(58) Field of Search ............................ 438/591, 592, 438/585, 584, 197, 201, 279, 267

(56) References Cited

U.S. PATENT DOCUMENTS

| | | |
|---|---|---|
| 4,532,695 A | 8/1985 | Schuermeyer |
| 4,683,645 A | 8/1987 | Naguib et al. |
| 4,745,082 A | 5/1988 | Kwok |
| 4,784,718 A | 11/1988 | Mitani et al. |
| 4,789,644 A | 12/1988 | Meda |
| 4,835,112 A | 5/1989 | Pfiester et al. |
| 4,954,867 A | 9/1990 | Hosaka |
| 4,998,150 A | 3/1991 | Rodder et al. ............ 357/23.1 |
| 5,102,816 A | 4/1992 | Manukonda et al. ......... 437/44 |
| 5,108,954 A | 4/1992 | Sandhu et al. |
| 5,258,637 A | 11/1993 | Sandhu et al. |
| 5,264,382 A | 11/1993 | Watanabe |
| 5,374,575 A | 12/1994 | Kim et al. |
| 5,391,510 A | 2/1995 | Hsu et al. |
| 5,393,685 A | 2/1995 | Yoo et al. |
| 5,429,956 A | 7/1995 | Shell et al. |
| 5,491,099 A | 2/1996 | Hsu |
| 5,516,707 A | 5/1996 | Loh et al. |
| 5,593,907 A | 1/1997 | Anjum et al. |
| 5,595,919 A | 1/1997 | Pan |
| 5,607,884 A | 3/1997 | Byun |
| 5,654,570 A | 8/1997 | Agnello |
| 5,675,159 A | 10/1997 | Oku et al. |
| 5,716,861 A | 2/1998 | Moslehi |
| 5,736,446 A | 4/1998 | Wu |
| 5,753,542 A | 5/1998 | Yamazaki et al. .......... 438/162 |

(List continued on next page.)

FOREIGN PATENT DOCUMENTS

| | | |
|---|---|---|
| JP | 3-248433 | 11/1991 |
| JP | 4-123439 | 4/1992 |
| JP | 5-160396 | 6/1993 |
| JP | 5-206454 | 8/1993 |
| JP | 8-17845 | 1/1996 |
| JP | 11-102907 | 4/1999 |

OTHER PUBLICATIONS

"Sub 50nm FinFET: PMOS" Huang, et al. Department of Electrical Engineering and Computer Sciences, University of California at Berkley, 1999, IEEE.

(List continued on next page.)

Primary Examiner—David Nelms
Assistant Examiner—Thao P Le
(74) Attorney, Agent, or Firm—Foley & Lardner (57) ABSTRACT

A method of forming a dielectric gate insulator in a transistor is disclosed herein. The method includes providing a gate structure including a layer of material over a semiconductor structure, siliciding the substrate, and transforming the layer of material into a gate dielectric material. The gate dielectric material can be a high-k gate dielectric material.

20 Claims, 3 Drawing Sheets

U.S. PATENT DOCUMENTS

| | | | |
|---|---|---|---|
| 5,793,090 A | 8/1998 | Gardner et al. | |
| 5,811,323 A | 9/1998 | Miyasaka et al. | |
| 5,825,066 A | 10/1998 | Buynoski | |
| 5,851,869 A | 12/1998 | Urayama | |
| 5,856,225 A | 1/1999 | Lee et al. | |
| 5,858,843 A | 1/1999 | Doyle et al. | |
| 5,888,888 A | 3/1999 | Talwar et al. | |
| 5,908,307 A | 6/1999 | Talwar et al. | |
| 5,915,182 A | 6/1999 | Wu | |
| 5,915,196 A | 6/1999 | Mineji | |
| 5,953,616 A | 9/1999 | Ahn | |
| 5,960,270 A * | 9/1999 | Misra et al. | 438/197 |
| 5,985,726 A | 11/1999 | Yu et al. | |
| 6,008,111 A | 12/1999 | Fushida et al. | |
| 6,017,808 A | 1/2000 | Wang et al. | |
| 6,025,254 A * | 2/2000 | Doyle et al. | 438/592 |
| 6,030,863 A | 2/2000 | Chang et al. | |
| 6,037,204 A | 3/2000 | Chang et al. | |
| 6,051,473 A | 4/2000 | Ishida et al. | 438/300 |
| 6,072,222 A | 6/2000 | Nistler | |
| 6,080,645 A | 6/2000 | Pan | |
| 6,087,235 A | 7/2000 | Yu | |
| 6,096,614 A | 8/2000 | Wu | |
| 6,100,787 A | 8/2000 | Chan et al. | |
| 6,103,609 A | 8/2000 | Lee et al. | |
| 6,110,783 A | 8/2000 | Burr | |
| 6,137,149 A | 10/2000 | Kodama | |
| 6,150,221 A | 11/2000 | Aoyama | |
| 6,156,613 A | 12/2000 | Wu | |
| 6,184,097 B1 | 2/2001 | Yu | |
| 6,187,642 B1 | 2/2001 | Yu et al. | |
| 6,190,977 B1 | 2/2001 | Wu | |
| 6,200,867 B1 | 3/2001 | Chen | |
| 6,228,722 B1 * | 5/2001 | Lu | 438/279 |
| 6,300,201 B1 * | 10/2001 | Shao et al. | 438/281 |
| 6,300,203 B1 * | 10/2001 | Buynoski et al. | 438/287 |

OTHER PUBLICATIONS

"Ultra–Thin–Body Silicon–On–Insulator MOSFET's for Terabit–Scale Integration" Yu, et al., Department of Electrical & Computer Sciences.

"Sub–100nm Gate Length Metal Gate NMOS Transistors Fabricated by a Replacement Gate Process", Chatterjee, et al., International Electronic Devices Meeting, Dec. 7–10, 1997.

"Silicon Processing for the VLSI Era, vol. 1: Process Technology", Wolf, et al., Lattice Press, pp 296–308.

"Silicon Processing for the VLSI Era, vol. 2: Process Integration" Wolf, et al., Lattice Press, pp 66, 67, 72, 73, 154, 155, 157, 158.

"Recrystallization of Implanted Amorphous Silicon Layers. I. Electrical Properties of Silicon Implanted with BF+2 or Si+ + B+a)" by Tsai, et al. Journal of Applied Physics, vol. 50, No. 1, Jan. 1979.

U.S. patent application Ser. No. 09/780,043 filed Feb. 09, 2001 "Fully Depleted SOI Transistor with Elevated Source and Drain" (Atty Dkt No. 39153/414).

U.S. patent application Ser. No. 09/779,985 filed Feb. 9, 2001 "A Replacement Gate Process for Transistors having Elevated Source and Drain Regions" (Atty Dkt No. 39153/407).

U.S. patent application Ser. No. 09/779,987 filed Feb. 9, 2001 "A Process for Manufacturing MOS Transistors Having Elevated Source and Drain" (Atty Dkt No. 39153/412).

U.S. patent application Ser. No. 09/779,986 filed Feb. 9, 2001. "A Low Temperature Process for Thin Film Transistor" (Atty Dkt No. 39153/413).

U.S. patent application Ser. No. 09/405,831 filed Sep. 24, 1999 "Process for Manufacturing MOS Transistors Having Elevated Source and Drain" (Atty Dkt. No. 39153/219).

U.S. patent application Ser. No. 09/779,988 filed Feb. 9, 2001 "A Low–Temperature Process for a Thin Film Transistor" (Atty Dkt No. 39153/417).

U.S. patent application Ser. No. 09/609,613 filed Jul. 5, 2000 "Low Thermal Budget Process for Manufacturing MOS Transistors having Elevated Source and Drain Regions" (Atty Dkt No. 39153/269).

U.S. patent application Ser. No. 09/255,546 filed Feb. 22, 1999 "Locally Confined Deep Pocket Process for USLI MOSFETS" (Atty Dkt No. 39153/133).

U.S. patent application Ser. No. 09/397,217 filed Sep. 16, 1999 "Source/Drain Doping Technique for Ultra–Thin Body SOI MOS" Atty Dkt. No. 39153/203).

"CMOS Metal Replacement Gate Transistors Using Tantalum Pentoxide Gate Insulator", Chatterjee, et al. IEDM, 1998.

* cited by examiner

LOW TEMPERATURE PROCESS TO LOCALLY FORM HIGH-K GATE DIELECTRICS

CROSS REFERENCE TO RELATED APPLICATIONS

This patent application is related to U.S. Pat. No. 6,100,120 issued to Yu on Aug. 8, 2000. This patent application is also related to U.S. patent application Ser. No. 09/779,987 (Attorney Docket No. 39153-412), filed on an even date herewith by Yu, entitled "A Process For Manufacturing MOS Transistors Having Elevated Source and Drain Regions and a Gate," U.S. patent application Ser. No. 09/779,985 (Attorney Docket No. 39153-407), filed on an even date herewith by Yu, entitled "Replacement Gate Process for Transistor Having Elevated Source and Drain," U.S. patent application Ser. No. 09/780,043 (Attorney Docket No. 39153-414), filed on an even date herewith by Yu, entitled "Fully Depleted SOI or with Elevated Source and Drain," U.S. patent application Ser. No. 09/779,988 (Attorney Docket No. 39153-417), filed on an even date herewith by Yu, entitled "Low Temperature Process for MOSFET with Elevated Source and Drain," and U.S. patent application Ser. No. 09/779,986 (Attorney Docket No. 39153-413), filed on an even date herewith by Yu, entitled "A Low Temperature Process For A Thin Film Fully Depleted SOI MOSFET." All of the above patent applications are assigned to the assignee of the present application.

FIELD OF THE INVENTION

The present specification relates to integrated circuits (ICs) and methods of manufacturing integrated circuits. More particularly, the present specification relates to a method of manufacturing integrated circuits having transistors with high-k gate dielectrics.

BACKGROUND OF THE INVENTION

Currently, deep-submicron complementary metal oxide semiconductor (CMOS) is the primary technology for ultra-large scale integrated (ULSI) devices. Over the last two decades, reducing the size of CMOS transistors and increasing transistor density on ICs has been a principal focus of the microelectronics industry. An ultra-large scale integrated circuit (ULSI) can include over 1 million transistors.

The ULSI circuit can include CMOS field effect transistors (FETS) which have semiconductor gates disposed between drain and source regions. The drain and source regions are typically heavily doped with a P-type dopant (boron) or an N-type dopant (phosphorous).

The drain and source regions generally include a thin extension (shallow source and drain extensions) that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-induced barrier-lowering. Shallow source and drain extensions and, hence, controlling short-channel effects, are particularly important as transistors become smaller.

Conventional techniques utilize a double implant process to form shallow source and drain extensions. According to a conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion implantation process. Without the sidewall spacers, the doping process introduces dopants into a thin region just below the top surface of the substrate to form the drain and source extensions as well as to partially form the drain and source regions.

After the drain and source extensions are formed, silicon dioxide spacers, which abut lateral sides of the gate structure, are provided over the source and drain extensions. With the silicon dioxide spacers in place, the substrate is doped a second time to form deep source and drain regions. During formation of the deep source and drain regions, further doping of the source and drain extensions is inhibited due to the blocking capability of the silicon dioxide spacers. After doping, the source and drain regions are annealed in a high temperature process to activate the dopants in the source and drain regions.

High temperature processes over 750 to 800° C. can cause dielectric materials with a high dielectric constant (k) to react with the substrate (e.g., silicon). High-k (k>20) gate dielectrics are desirable as critical transistor dimensions continue to decrease. The reduction of critical transistor dimensions requires that the thickness of the gate oxide also be reduced. A major drawback to the decreased gate oxide thickness (e.g., <30 Å) is that direct tunneling gate leakage current increases as gate oxide thickness decreases. To suppress gate leakage current, material with a high dielectric constant (k) can be used as a gate dielectric instead of the conventional gate oxides, such as thermally grown silicon dioxide.

High-k gate dielectric materials have advantages over conventional gate oxides. A high-k gate dielectric material with the same effective electrical thickness (same capacitive effect) as a thermal oxide is much thicker physically than the conventional oxide. Being thicker physically, the high-k dielectric gate insulator is less susceptible to direct tunnel leakage current. Tunnel leakage current is exponentially proportional to the gate dielectric thickness. Thus, using a high-k dielectric gate insulator significantly reduces the direct tunneling current flow through the gate insulator.

High-k dielectric materials include, for example, aluminum oxide ($Al_2O_3$), titanium oxide ($Ti_2O_3$), silicon nitride ($Si_3N_4$) and tantalum pentaoxide ($TaO_5$). Aluminum oxide has a dielectric constant (k) equal to eight (8) and is relatively easy to make as a gate insulator for a very small transistor. Small transistors often have a physical gate length of less than 80 nm.

Silicidation processes can adversely affect high-k gate dielectric materials of the gate stack. Silicidation processes often utilize high temperature deposition on low temperature deposition combined with a heating step. For example, silicidation processes, such as, cobalt silicidation processes, often require temperatures of 800–825° C. which can cause the high-k gate dielectric material to react with the substrate or the gate conductor.

Thus, there is a need for transistors manufactured in an optimized silicidation process. Yet further, there is a need for a transistor with elevated source and drain regions and a high-k gate dielectric. Yet even further, there is a need for a process of forming a transistor with silicided source and drain regions and a high-k gate dielectric. Further, there is a need for a process flow which forms high-k gate dielectric films after silicidation of drain and source regions. Even further, there is a need for a process that utilizes a high temperature (greater than 750° C.) silicidation technique and a high-k gate dielectric layer. Even further still, there is a need for a method of forming a high-k gate dielectric layer after source and drain silicidation.

SUMMARY OF THE INVENTION

An exemplary embodiment relates to a method of forming a dielectric insulator for a transistor. The method includes providing a sacrificial gate structure on a substrate, forming source/drain regions, siliciding the source/drain regions, removing the sacrificial gate material, and transforming metal material into a high-k gate dielectric material for the dielectric insulator. The gate structure includes the layer of metal material above the substrate. The gate structure also includes the sacrificial gate material above the metal material.

Another exemplary embodiment relates to a method of manufacturing integrated circuit. The method includes providing a gate structure, providing a silicide layer next to at least one side of the gate structure, removing a sacrificial layer in the gate structure, and forming a dielectric gate insulator. The dielectric gate insulator is formed from a metal layer associated with the gate structure.

Yet another exemplary embodiment relates to a method of forming a gate structure. The gate structure includes a high-k dielectric layer. The method includes the following steps in the following order: depositing a metal layer above a substrate, depositing a sacrificial layer above the metal layer, etching the sacrificial layer and the metal layer, siliciding the substrate, removing the sacrificial layer, and forming the high-k dielectric layer using the metal layer. The etching of the sacrificial and the metal layer defines the gate structure. The sacrificial layer is removed from the gate structure. The high-k gate dielectric layer is formed within the gate structure.

BRIEF DESCRIPTION OF THE DRAWINGS

Exemplary embodiments will hereafter be described with reference to the accompanying drawings, wherein like numerals denote like elements, and.

DETAILED DESCRIPTION OF THE PREFERRED EMBODIMENTS

Figure 1:
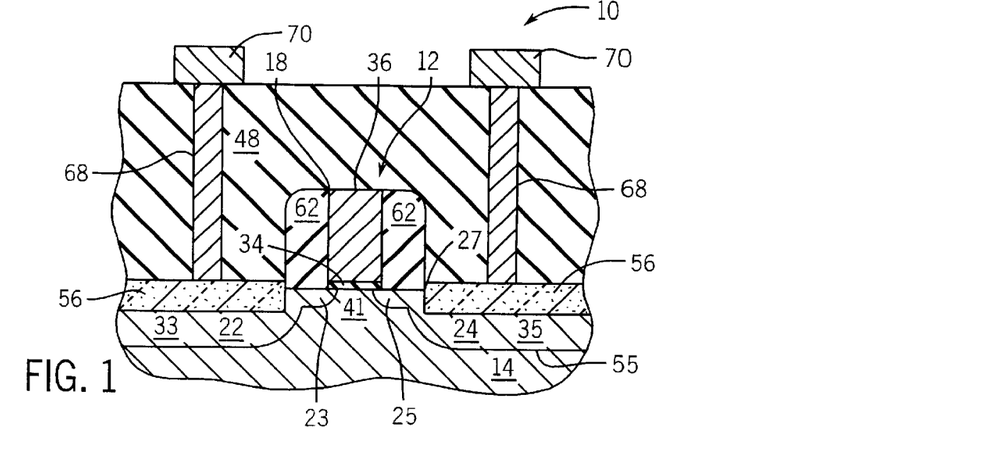
FIG. 1 is a cross-sectional view of a portion of an integrated circuit in accordance with an exemplary embodiment of the present invention, the integrated circuit including a transistor with silicided source/drain regions and a gate dielectric.

With reference to FIG. 1, a portion 10 of an integrated circuit (IC) includes a transistor 12 which is disposed on a semiconductor substrate 14, such as, a wafer. Semiconductor substrate 14 is preferably a bulk P-type silicon substrate. Alternatively, substrate 14 can be any type of IC substrate including a gallium arsenide (GaAs), germanium, or a semiconductor-on-insulator (SOI) substrate (e.g., a silicon-on-glass substrate).

Transistor 12 can be a P-channel or N-channel metal oxide semiconductor field effect transistor (MOSFET) and is described below as an N-channel transistor. Transistor 12 includes a gate structure 18, a source region 22, and a drain region 24. Alternatively, regions 22 and 24 can be embodied as elevated sources/drain regions.

Regions 22 and 24 extend from a top surface 27 of substrate 14 to a bottom 55 in substrate 14. Regions 22 and 24 are 500–1500 Å deep (from surface 27 to bottom 55) and include a source extension 23, a drain extension 25, a deep source region 33, and a deep drain region 35. For an N-channel transistor, regions 22 and 24 are heavily doped with N-type dopants (e.g., $5\times10^{19}$–$1\times10^{20}$ dopants per cubic centimeter). For a P-channel transistor, regions 22 and 24 are heavily doped with P-type dopants ($5\times10^{19}$–$1\times10^{20}$ dopants per cubic centimeter).

Extensions 23 and 25 are preferably ultra-shallow extensions (e.g., junction depth is less than 20 nanometers (nm), 100–250 Å), which are thinner than regions 33 and 35. Extensions 23 and 25 are connected to regions 33 and 35, respectively, and are disposed partially underneath gate structure 18. Regions 33 and 35 are preferably more than 100 Å thick (e.g. 500 to 1500 Å) from surface 27 to bottom 55. A channel region 41 underneath gate structure 18 separates extensions 23 and 25.

Ultra-shallow extensions 23 and 25 help transistor 12 achieve substantial immunity to short-channel effects. Short-channel effects can degrade the performance of transistor 12 as well as the manufacturability of the IC associated with transistor 12. Regions 33 and 35 and extensions 23 and 25 have a concentration of $10^{19}$ to $10^{20}$ dopants per cubic centimeter. An appropriate dopant for a P-channel transistor is boron, boron diflouride, or iridium, and an appropriate dopant for an N-type transistor is arsenic, phosphorous, or antimony.

Gate stack or structure 18 includes a gate dielectric layer 34 and a gate conductor 36. Structure 18 can be 500–2000 Å thick (height) and 30–200 Å wide. Dielectric layer 34 can be comprised of a high-k dielectric material. Layer 34 is preferably a 2–40 nm thick conformal layer of tantalum pentaoxide ($Ta_2O_5$), aluminum oxide ($Al_2O_3$), titanium dioxide ($Ti_2O$), or other material having a dielectric constant (k) over 20. In one preferred embodiment, layer 34 is a 1–2 nm thick layer of aluminum oxide having a dielectric constant of 8 or more.

Gate conductor 36 is disposed above dielectric layer 34. Gate conductor 36 is preferably 500–2000 Å thick. Conductor 36 can be a metal, such as titanium nitride (TiN), tungsten (W), Molybdenum (Mo), Aluminum (Al), or composites and alloys thereof. Alternatively, conductor 36 can be polysilicon or polysilicon/germanium. In one preferred embodiment, conductor 36 is 1500 Å thick layer of polysilicon.

Gate structure 18 is disposed over channel region 41. Gate structure 18 can also include oxide liners or spacers 62. Spacers 62 abut sidewalls of gate conductor 36. Spacers 62 are preferably silicon dioxide ($SiO_2$). Alternatively, spacers 62 can be a low-k dielectric material, or silicon nitride ($Si_3N_4$) material, or other insulator. Preferably, spacers 62 have a width of 300–800 Å and a thickness (height) of 500–2000 Å.

A silicide layer 56 is disposed on top of source region 22 and drain region 24. Preferably, layer 56 is a cobalt silicide ($CoSi_x$) material. Alternatively, layer 56 can be any type of refractory metal and silicon combination, such as, a nickel silicide, tungsten silicide, or other silicide material. Preferably, layer 56 is 150–400 Å thick.

Conductive contacts 68 can be coupled to layer 56 through an insulating layer 48 (e.g., interlevel dielectric layer Ø) to connect regions 22 and 24 to conductive lines 70. Layer 48 can be 500–2000 Å thick silicon dioxide layer.

Contacts 68 can be a metal material or composite metal material, such as a contact including tungsten. Conductive lines 70 can be aluminum or any conventional interconnect material (e.g., metal layer 1).

Transistor 12 can be an N-channel or a P-channel field effect transistor, such as, a metal oxide semiconductor field effect transistor (MOSFET). Transistor 12 is at least partially covered by insulative layer 48 and is preferably part of an ultra-large scale integrated (ULSI) circuit that includes one million or more transistors.

With reference to FIGS. 1–8, the fabrication of transistor 12, including gate dielectric layer 34 and silicide layer 56 above source region 22 and drain region 24, is described as follows. The advantageous process allows silicide layer 56 above source and drain regions 33 and 35 to be formed with appropriate dopant activation without adversely affecting dielectric layer 34. The process forms regions 22 and 24 and layer 56 before layer 34, thereby reducing the thermal budget for steps subsequent the formation of layer 34 (achieving lower post-gate fabrication process temperatures).

Figure 2:
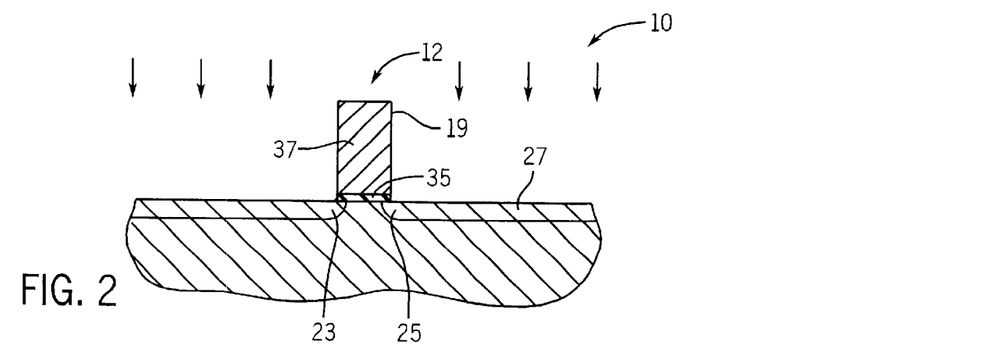
FIG. 2 is a cross-sectional view of the portion of the integrated circuit illustrated in FIG. 1, showing a gate stack formation step and a shallow source/drain extension dopant implant step.

With reference to FIG. 2, portion 10 includes a sacrificial gate stack or gate structure 19 including a sacrificial gate conductor 37 and a layer 35. Preferably, layer 35 is deposited or formed on top of surface 27 of substrate 14 and sacrificial conductor 37 is deposited or formed over layer 35.

Conductor 37 and layer 35 are selectively etched to leave gate structure 19 on a top surface 27 of substrate 14. Preferably, conductor 37 is 500 to 2000 Å thick above a 10 Å to 50 Å thick layer 35. Conductor 37 can be deposited by chemical vapor deposition (CVD).

Sacrificial gate conductor 37 (e.g., dummy gate) can be a silicon nitride material. Layer 35 is preferably a metal material. For example, layer 35 can be a tantalum, titanium, or aluminum layer. Preferably, layer 35 is a 10–20 Å thick layer of aluminum deposited by CVD. Conductor 37 is a sacrificial material and can be any type of material, including insulative or semiconductive materials. Preferably, material for conductor 37 is chosen to have different etch characteristics than layer 35 and spacers 62 (FIG. 1).

After gate structure 19 is formed, substrate 14 is subjected to a dopant implant (a shallow source drain extension dopant implant). Preferably, N-type or P-type dopants are provided by ion implantation to a depth of 100–250 Å below surface 27 of substrate 14. The dopants can be implanted in a conventional ion implantation technique (e.g., as ions at 500–1000 keV at a dose of $2\times10^{14}$–$1\times10^{15}$ dopants per square centimeter). Ion implantation can be performed by implantation devices manufactured by companies, such as, Verion Company of Palo Alto, Calif., Genius Company, and Applied Materials, Inc. The source drain extension dopant implant is for the formation of extensions 23 and 25 (FIG. 1) in substrate 14. Alternatively, other doping techniques can be utilized to for extensions 23 and 25.

Figure 3:
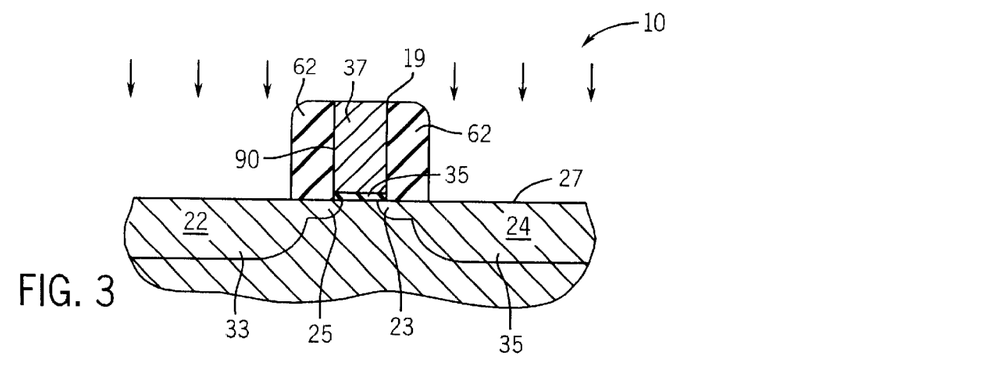
FIG. 3 is a cross-sectional view of the portion of the integrated circuit illustrated in FIG. 2, showing a spacer structure formation step and a deep source/drain dopant implant step.

In FIG. 3, portion 10 is subjected to a spacer formation process which creates spacers 62 on sidewalls 90 of gate structure 19. Preferably, spacers 62 are an oxide material and are formed in a conventional CVD and etch-back process. Spacers 62 can be silicon dioxide ($SiO_2$) spacers formed in a tetraethylorthosilicate (TEOS) CVD and dry etch-back process.

After spacers 62 are formed, substrate 14 is subject to a dopant implant (a deep source/drain dopant implant). Preferably, N-type or P-type dopants are provided by ion implantation to a depth of 500–1500 Å below surface 27. Dopants can be implanted according to a technique similar to the technique utilized for the shallow source/drain extension dopant implant discussed with reference to FIG. 2.

Dopants can be implanted in a conventional implantation technique (e.g., as ions at 10–100 keV at a dose of $1\times10^{15}$–$5\times10^{15}$ dopants per square centimeter). The deep source drain implant is for the formation of deep source region 33 and deep drain region 35 (FIG. 1) in substrate 14. Alternatively, other doping techniques can be utilized for regions 33 and 35.

After implantation, substrate 14 is subject to a thermal annealing process. The thermal annealing process activates dopants within regions 22 and 24. The thermal annealing process can be performed at a temperature of 850–900 degrees C. Various annealing techniques can be utilized including laser annealing, rapid thermal annealing (RTA) or other techniques for activating dopants in regions 22 and 24. High temperatures can be utilized to activate dopants in regions 22 and 24 because layer 34 embodied as a high-gate dielectric layer has not yet been formed.

Figure 4:
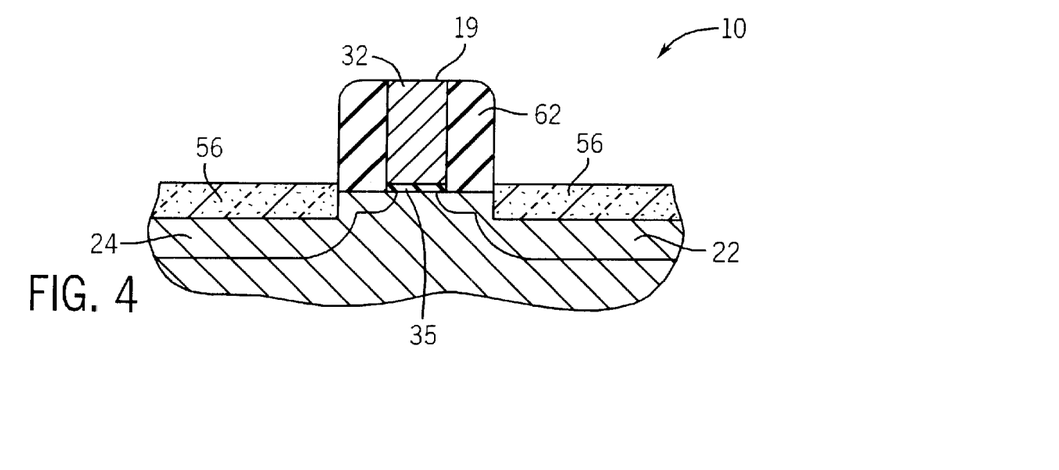
FIG. 4 is a cross-sectional view of the portion of the integrated circuit illustrated in FIG. 3, showing a silicidation step.

In FIG. 4, layer 56 is formed above regions 22 and 24. Layer 56 can be formed in a self-aligned silicidation process. The process is preferably a cobalt silicide process having an anneal temperature of 800–825 degrees Celsius.

According to one embodiment, a cobalt layer is deposited over regions 22 and 24. After deposition, the cobalt layer is heated to react with substrate 14 and form layer 56. Layer 56 is preferably 150–400 Å thick and consumes 30% percent of its thickness from substrate 14. High temperature processes can be utilized for layer 56 because gate dielectric layer 34 has not yet been formed. Alternatively, layer 56 can be a titanium silicide, nickel silicide, tungsten silicide, or other material.

Figure 5:
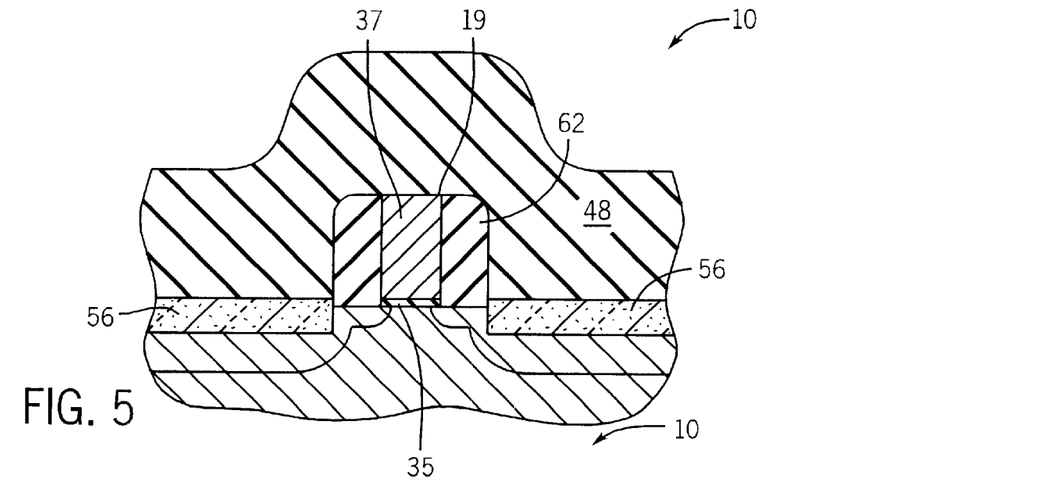
FIG. 5 is a cross-sectional view of the portion of the integrated circuit illustrated in FIG. 4, showing an insulative layer deposition step.

In FIG. 5, after layer 56 is formed, layer 56 and gate structure 19 are covered in insulative layer 48. Insulative layer 48 can be a 2000–5000 Å thick oxide layer (e.g., $SiO_2$) deposited in a tetraethylorthosilicate process (TEOS). Layer 48 can serve as at least part of an interlevel dielectric layer. Alternatively, other insulative layers or compositions can be utilized for layer 48.

Figure 6:
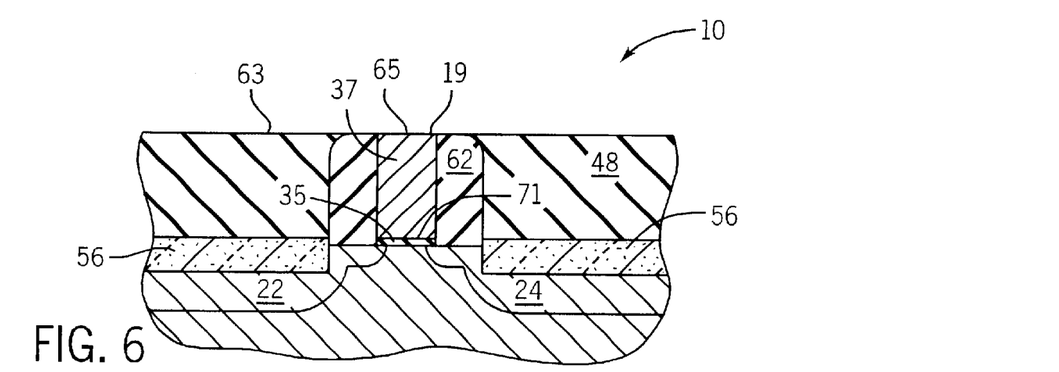
FIG. 6 is a cross-sectional view of the portion of the integrated circuit illustrated in FIG. 1, showing a chemical mechanical polish (CMP) step.

In FIG. 6, after layer 48 is provided over substrate 14, layer 48 is subject to a planarization process, such as, a chemical mechanical polish (CMP). The CMP step removes layer 48 to expose sacrificial gate conductor 37 in structure 19. Preferably, layer 48 has a top surface 63 co-planar with a top surface 65 of gate conductor 37.

Figure 7:
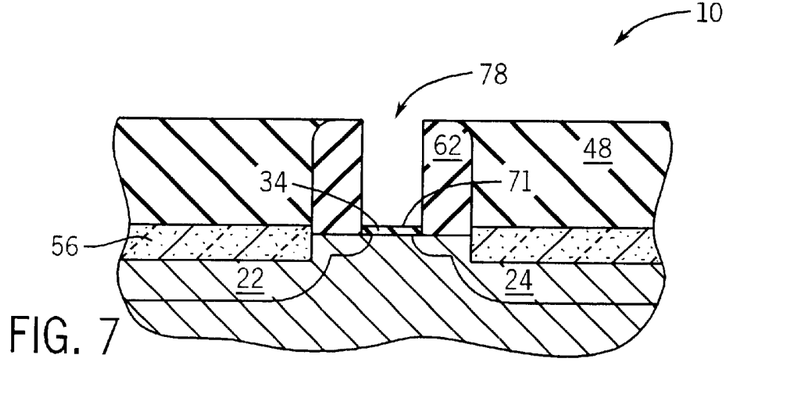
FIG. 7 is a cross-sectional view of the portion of the integrated circuit illustrated in FIG. 1, showing a sacrificial gate conductor removal step and a gate dielectric formation step.

In FIG. 7, gate conductor 37 is removed to form an aperture 78. Aperture 78 is preferably 300–2000 Å wide. Preferably, a wet chemical etch is utilized to remove sacrificial gate conductor 37. The wet chemical etch can be selective to silicon nitride if conductor 37 is a silicon nitride material. In a preferred embodiment, the wet chemical etch is not selective to the oxide material associated with spacer 62 or the metal material associated with layer 34. The wet chemical etch can be a H3PO4 acid process. Alternatively, plasma dry etching or other techniques can be utilized to remove gate conductor 37 depending upon process parameters and materials.

After sacrificial gate conductor 37 is removed and a top surface 71 (FIG. 6) of layer 35 is exposed, layer 35 is transformed into dielectric layer 34. Preferably, layer 35 is transformed into a high-k gate (k greater than 8) dielectric layer. Layer 35 can be transformed into a metal oxide material having a high-k dielectric constant. For example, if layer 35 is aluminum, layer 34 can be a high-k aluminum oxide ($Al_2O_3$) film. Layer 35 can be transformed in a low temperature (200–300° C. thermal process). Local thermal oxidation of layer 35 can create layer 34. Although low temperatures are preferred, temperature requirements can vary depending upon the type of material utilized for layer 35.

In the preferred embodiment, layer 35 is aluminum and is oxidized at a temperature between 250–300° C. Preferably, layer 34 is grown to a thickness of 10–°Å and is 300–2000 Å wide. Layer 34 is formed within aperture 78 associated with the removal of conductor 35. Dielectric layer 34 can be slightly wider (less than 5 percent wider than aperture 78). The above process provides a substantial uniform thickness for layer 34. In addition, difficulties associated with etching high-k gate dielectric layers are removed because layer 35 is etched before being transformed into layer 34.

According to an alternate embodiment, layer 35 can be removed by an etching process and layer 34 can be formed in a deposition or sputtering process. However, sputtering and deposition may have undesirable non-uniform thicknesses.

Figure 8:
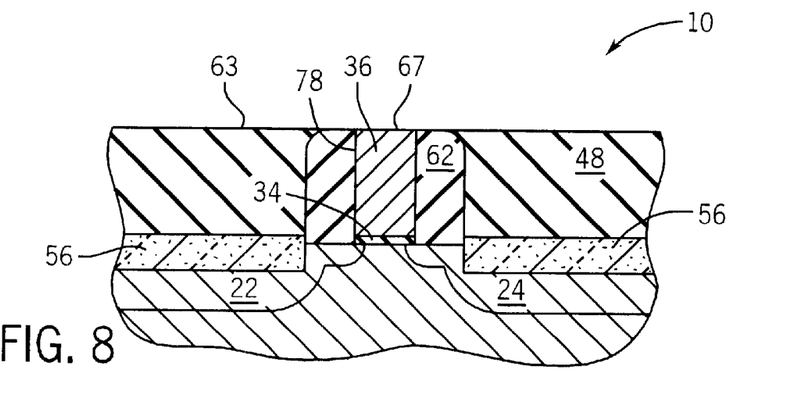
FIG. 8 is a cross sectional view of the portion of the integrated circuit illustrated in FIG. 1, showing a gate conductor refill step.

In FIG. 8, after layer 34 is formed, aperture 78 is filled with gate conductor 36. Preferably, gate conductor 36 is a metal material, such as a titanium nitride, tungsten, molybdenum, or other conductor. A conformal layer of the material for gate conductor 36 can be deposited over layer 48 and within aperture 78. The layer is ansotropically etched to leave conductor 36 in aperture 78. Alternatively, any deposition and polish process can be utilized to refill aperture 78 with conductor 36.

In FIG. 1, after conductor 36 is provided, an additional insulative layer can be provided to increase the height of insulative layer 48. After the insulative layer 48 is completed, a planarization process can be performed on layer 48 and vias for contacts 68 can be etched. Contacts 68 can be provided to connect to layers 56 conductive lines 70. Lines 70 can be formed above layer 48 and be connected to contact 68. Conventional integrated circuit fabrication processes can be utilized to provide various other connections and form other devices necessary for portion 10 of the integrated circuit.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of structures are shown, other structures can be utilized. Various changes may be made to the details disclosed without departing from the scope of the invention which is defined by the following claims.

What is claimed is:

1. A method of forming a dielectric gate insulator for a transistor, the method comprising:

provided a sacrificial gate structure on a substrate, the sacrificial gate structure including a layer of metal material above the substrate and a sacrificial gate material above the metal material;

forming source/drain regions;

siliciding the source/drain regions;

a removing the sacrificial gate material; and transforming the metal material into a high-k gate dielectric material for the dielectric gate insulator, wherein the sacrificial gate material includes nitride.

2. The method of claim 1, wherein the transforming includes oxidation of the metal material.

3. The method of claim 1, further comprising covering the source/drain regions with an insulative layer and polishing the insulative layer to expose the sacrificial gate material after the siliciding step.

4. A method of forming a dielectric gate insulator for a transistor, the method comprising:

providing a sacrificial gate structure on a substrate, the sacrificial gate structure including a layer of metal material above the substrate and a sacrificial gate material above the metal material;

forming source/drain regions;

siliciding the source/drain regions;

removing the sacrificial gate material; and transforming the metal material into a high-k gate dielectric material for the dielectric gate insulator, wherein the layer of metal material comprises aluminum, wherein the transforming step thermally oxidizes the aluminum and provides aluminum oxidation at a temperature between 250–300° C.

5. The method of claim 1, wherein the transforming step thermally oxidizes the aluminum and provides aluminum oxidation at a temperature between 250–300° C.

6. The method of claim 4, wherein the sacrificial gate material includes nitride.

7. The method of claim 6, wherein said gate dielectric insulator is formed by thermal oxidation and without directly sputtering or depositing as a gate insulator.

8. The method of claim 1, wherein the transforming step is by thermal oxidation and without directly sputtering or depositing as a gate insulator.

9. A method of manufacturing an integrated circuit, comprising:

providing a gate structure including a metal layer and a sacrificial layer;

providing a silicide layer next to at least one side of the gate structure;

removing the sacrificial layer; and forming a dielectric gate insulator from the metal layer, the sacrificial layer being a silicon nitride layer.

10. The method of claim 9, further comprising:

forming a gate conductor over the dielectric gate insulator.

11. The method of claim 9, wherein the forming the dielectric gate insulator step results in a material having a high dielectric constant.

12. The method of claim 9, wherein the dielectric gate insulator is formed without directly sputtering or depositing the dielectric gate insulator.

13. The method of claim 9, wherein the dielectric gate insulator includes titanium oxide.

14. The method of claim 9, wherein the dielectric gate insulator is tantalum pentaoxide.

15. The method of claim 9, wherein the forming the dielectric gate insulator step provides a uniform thickness for the dielectric gate insulator.

16. The method of claim 9, wherein the metal layer is aluminum, tantalum, or titanium, and the high-k gate dielectric is an oxidized form of the metal layer.

17. The method of claim 9, wherein the forming step is by thermal oxidation at a temperature between 250–300° C.

18. A method of manufacturing an integrated circuit, comprising:

provided a gate structure including a metal layer and a sacrificial layer;

providing a silicide layer next to at least one side of the gate structure;

removing the sacrificial layer; and a forming a dielectric gate insulator from the metal layer, wherein the dielectric gate insulator is aluminum oxide, wherein the forming step thermally oxides the metal layer at a temperature between 250 to 300° C.

19. The method of claim 9, wherein the forming the dielectric gate insulator step is selectively performed in a channel gate area.

20. The method of claim 9, wherein the dielectric gate insulator is formed without etching the gate dielectric insulator.

* * * * *

UNITED STATES PATENT AND TRADEMARK OFFICE
CERTIFICATE OF CORRECTION

PATENT NO. : 6,495,437 B1
DATED : December 17, 2002
INVENTOR(S) : Bin Yu It is certified that error appears in the above-identified patent and that said Letters Patent is hereby corrected as shown below:

Column 8,
Line 12, delete the word "a" before the word "removing".
Line 37, delete "1" between the words "claim" and "wherein" and insert -- 4 --.
Line 38, delete the word "the" between the words "oxidizes" and "aluminum".

Signed and Sealed this

Twenty-seventh Day of May, 2003

JAMES E. ROGAN
*Director of the United States Patent and Trademark Office*